United States Patent [19]

Chen et al.

[11] Patent Number: 5,759,869
[45] Date of Patent: Jun. 2, 1998

[54] METHOD TO IMPORVE METAL STEP COVERAGE BY CONTACT REFLOW

[75] Inventors: Fusen E. Chen, Dallas; Frank Randolph Bryant, Denton; Girish Anant Dixit, Dallas, all of Tex.

[73] Assignee: SGS-Thomson Microelectronics, Inc., Carrollton, Tex.

[21] Appl. No.: 480,936

[22] Filed: Jun. 7, 1995

Related U.S. Application Data

[60] Continuation of Ser. No. 36,222, Mar. 24, 1993, abandoned, which is a division of Ser. No. 816,633, Dec. 31, 1991, abandoned.

[51] Int. Cl.$^6$ .................................................. H01L 21/311
[52] U.S. Cl. ........................ 437/195; 437/228; 437/240; 437/947; 437/982
[58] Field of Search ........................ 437/238, 239, 437/240, 195, 228, 947, 982

[56] References Cited

U.S. PATENT DOCUMENTS

| | | | |
|---|---|---|---|
| 3,967,310 | 6/1976 | Horiuchi et al. | 357/54 |
| 4,204,894 | 5/1980 | Komeda et al. | 437/982 |
| 4,352,724 | 10/1982 | Sugishima et al. | 204/192 E |
| 4,372,034 | 2/1983 | Bohr | 437/947 |
| 4,807,016 | 2/1989 | Douglas . | |
| 5,047,358 | 9/1991 | Kosiak et al. | 437/34 |
| 5,073,814 | 12/1991 | Cole, Jr. et al. | 357/54 |

FOREIGN PATENT DOCUMENTS

| | | | |
|---|---|---|---|
| 0403050 | 12/1990 | European Pat. Off. | 437/982 |
| 57-204161 | 12/1982 | Japan | 437/982 |
| 58-158931 | 9/1983 | Japan | 437/982 |
| 63-269548 | 11/1988 | Japan | 437/982 |
| 2-224226 | 9/1990 | Japan | 437/982 |
| 2-77130 | 9/1990 | Japan | 437/947 |

OTHER PUBLICATIONS

Nuhman, J., "In–Situ Processing of Silicon Dielectrics . . . ", in Rapid Thermal Processing of Electronic Materials, Wilson et al. ed., Material Research Society, 1987, pp. 141–146.

Wolf et al., Silicon Processing, vol. 1, Lattice Press, 1986, pp. 187–191, 218–219.

Nulman, J., "In–Situ Processing of Silicon Dielectrics . . ." in Rapid Thermal Processing of Electronic Materials, Wilson et al. ed., Material Research Society, 1987, pp. 141–146.

Primary Examiner—T. N. Quach
Attorney, Agent, or Firm—Theodore E. Galanthay; Kenneth C. Hill; Lisa K. Jorgenson

[57] ABSTRACT

A method for forming sloped contact corners of an integrated circuit, and an integrated circuit formed according to the same, is disclosed. A first oxide layer is formed over the integrated circuit. An insulating layer is formed over the oxide layer. The oxide and insulating layers are then patterned and etched to form a contact opening to expose a conductive region underlying a portion of the oxide layer. A second oxide layer is formed in the bottom of the contact opening. The insulating layer is then reflowed to form rounded contact corners after which the second oxide layer is removed.

5 Claims, 1 Drawing Sheet

METHOD TO IMPORVE METAL STEP COVERAGE BY CONTACT REFLOW

This is a continuation of application Ser. No. 08/036,222, filed on Mar. 24, 1993, abandoned, which is a division of application Ser. No. 07/816,633, filed Dec. 31, 1991 abandoned.

TECHNICAL FIELD

The present invention relates generally to semiconductor integrated circuit processing, and more specifically to improving step coverage for contacts and vias.

BACKGROUND OF THE INVENTION

Metal step coverage has been of prime importance throughout the history of integrated circuit (IC) manufacture. Step coverage, however, has still been a major problem for IC manufacturers even into the late 1980s. Poor step coverage can be found at the sharp vertical step found in metal to substrate contacts, metal to metal vias, and metal crossovers. As dimensions shrink, conventional techniques of producing sloped contacts and vias to improve step coverage fall short of expectations and are limited to stringent design criteria.

One method of improving step coverage has been realized through the use of thermal processing. Contact openings are formed through a dielectric layer such as borophosphorous silicate glass ("BPSG") using known dry etching processes. The sharp corners of the contacts resulting from the contact etch are rounded off by thermal processing at high temperatures. With the effect of surface tension, at temperatures close to melting point temperatures, almost all of the known insulating materials through which contact openings are formed tend to bead up eliminating sharp corners and reducing surface area. This reduction in surface area with no reduction in volume is a more thermodynamically stable arrangement.

The direct application, however, of thermal processing has certain disadvantages. For example, in the case of a metal contact, the contact resistance between metal and substrate is often reduced by the use of a suitable implant in the substrate. Thermal processing tends to nullify the effects of an implant in the active area because at melting point temperatures of reflow glass such as BPSG, the implanted species tend to diffuse out of the substrate and into the atmosphere before the metal layer is deposited. When such diffusion into the atmosphere occurs, a number of special implantation steps, according to the specific type of technology employed, may have to be added after thermal processing to achieve the desired contact resistance between metal and substrate.

Another disadvantage arises during reflow which causes dopants in the reflow glass to out diffuse into the implanted area in the substrate. The diffusion, for example, of boron from BPSG into an N+ source/drain region may form a P/N junction within the source/drain region or may compensate the N+ dose in a conductive region thus increasing the N+ contact resistance. Additional implants are then required to be made into the source/drain region to compensate for the boron diffusion. If the source/drain regions have been made in CMOS devices, two additional masking steps and two additional implants are required.

It would be desirable for a semiconductor process to minimize step coverage problems in contacts. It would be desirable for such fabrication technique to provide sloped contact corners suitable for use with small device geometries. It would further be desirable to provide such a technique that simplifies the manufacturing process.

SUMMARY OF THE INVENTION

Therefore, according to the present invention, a contact opening is formed through an insulating layer. An oxide layer is then formed in the bottom of the contact opening. The insulating layer is reflowed to form rounded contact corners. The oxide layer is then removed.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures represent a cross-section of a portion of an integrated circuit during fabrication. The figures are not drawn to scale, but instead are drawn so as to illustrate the important features of the invention.

Figure 1:
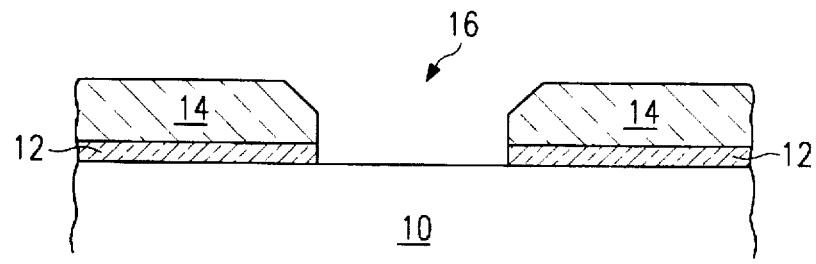
FIGS. 1-4 illustrate a preferred process flow according to the present invention.

Referring to FIG. 1, an integrated circuit is to be formed in a silicon substrate 10. An undoped oxide layer 12 is formed over the substrate 10. An insulating layer 14 such as borophosphorous silicate glass ("BPSG") is deposited over the entire surface of the chip. The undoped oxide layer 11 isolates the BPSG layer from the substrate thus protecting the substrate during subsequent manufacturing steps. The BPSG layer 14 and oxide layer 12 are then patterned and etched to form a contact opening 16. Deposition and patterning of the various layers may be varied to be made consistent with process flows for the devices being fabricated. In a typical embodiment, the BPSG may be deposited to a depth of approximately 4000 to 8000 Angstroms. As will be appreciated by those skilled in the art, the contact opening may be made to any device where a metal contact is required such as a source/drain region of a transistor in the substrate or the gate electrode of a transistor.

A combination wet and dry etch of the contact opening through the BPSG Layer 14 will result in the structure substantially as shown in FIG. 1. A wet etch will typically form sloped sidewalls and a dry etch typically will result in straight vertical sidewalls. The advantage of the sloped sidewalls at the top of the layer is that subsequent reflow of layer 14 will result in more rounded corners and provide for better step coverage. Alternative etch processes such as a dry etch which results in straight sidewalls, sloped sidewalls or partially sloped sidewalls, however, may be sufficient.

Figure 2:
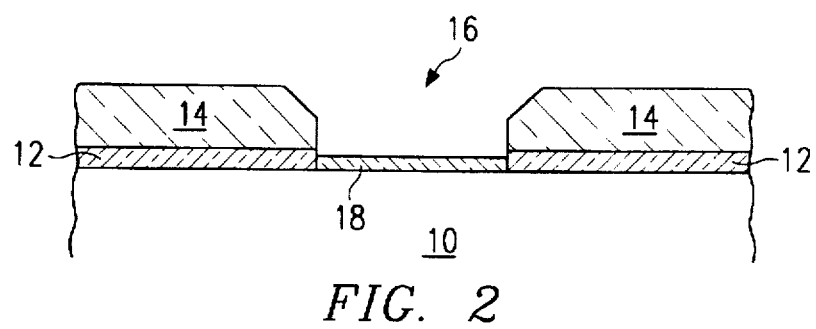

Referring to FIG. 2, an oxide region 18 is formed in the bottom of the contact opening 16. The oxide region 18 will typically have a thickness of between approximately 100 to 1000 angstroms. The oxide will be thick enough to passivate the underlying region during subsequent reflow of the BPSG layer while at the same time being thin enough to facilitate easy removal without significant loss of the BPSG layer. The oxide is formed at a temperature typically between 500° and 7000° C. The temperature should be low enough to prevent the dopants from the BPSG layer 14 from migrating into the layer under the oxide region 18.

Figure 3:
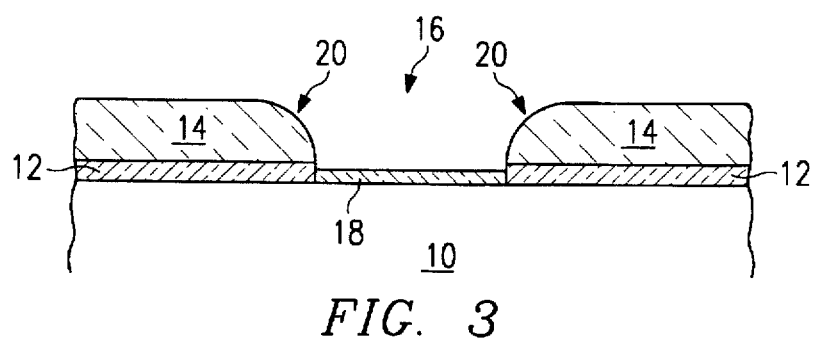

Referring to FIG. 3, the integrated circuit undergoes a thermal heat process such as a Rapid Thermal Annealing ("RTA") process or furnace reflow to cause the BPSG to become soft enough to flow out over the surface of the wafer and form rounded corners. The rounded corners result from the surface tension effect in which the BPSG layer tends to bead up at higher temperatures reducing the surface area while maintaining the same volume of glass material. The contact corners 20 of the BPSG layer 14 are rounded during reflow to improve metallization step coverage. The growth of oxide region 18 at an initial temperature and the reflow of the BPSG layer 14 at a higher temperature can be done in sequential process steps without removing the wafer from the furnace.

The thermal heat or anneal process and temperature may also be varied to be made consistent with process flows for the devices being fabricated. In a typical embodiment, the thermal heating of the BPSG layer 14 will occur at temperatures of approximately 800° to 11000° C. for a period of approximately 20 minutes to 1 hour. During this process, oxide region 18 has prevented dopants in the underlying substrate 10 from outgassing. The oxide layer 18 has also prevented dopants from the BPSG layer 14 from diffusing into the substrate 10.

Figure 4:
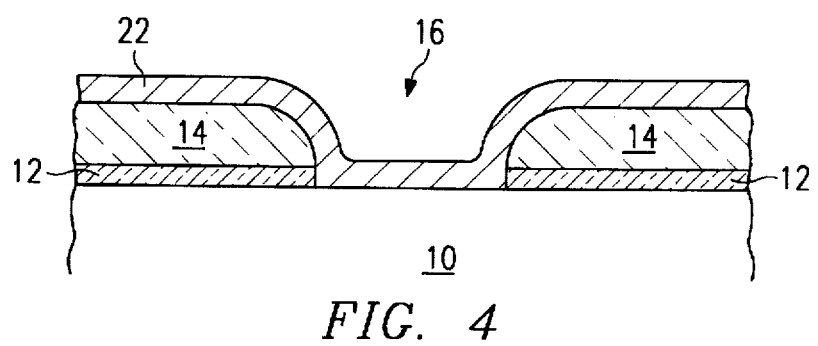

Referring to FIG. 4, the oxide region 18 is removed from the bottom of the contact opening 16. After the removal of the oxide region 18, a metal layer 22 is deposited and patterned by known methods forming a contact.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A method of producing sloped contact corners of an integrated circuit comprising the steps of:

forming a first oxide layer over a conductive region of the integrated circuit;

forming an reflowable insulating layer over the oxide layer;

performing a combined wet etch and a dry etch to form an opening through the reflowable insulating layer and the silicon oxide layer, wherein the opening has a bottom, vertical sidewalls in a lower portion of the reflowable insulating layer, and sloped sidewalls in a top portion of the reflowable insulating layer, and wherein a portion of the conductive region is exposed in the bottom of the opening;

forming a second oxide layer in the bottom of the contact opening;

reflowing the insulating layer to form rounded contact corners; and, removing the second oxide layer.

2. The method of claim 1, wherein the insulating layer comprises a BPSG layer.

3. The method of claim 1, wherein the conductive region is a gate electrode of a transistor.

4. The method of claim 1, wherein the steps of forming a second oxide layer and reflowing the insulating layer are performed sequentially in a furnace without removing the integrated circuit from the furnace.

5. The method of claim 1, wherein the conductive region is a source/drain region of a transistor in a substrate.

* * * * *